US011585850B2

(12) United States Patent
Chen et al.

(10) Patent No.: US 11,585,850 B2
(45) Date of Patent: Feb. 21, 2023

(54) METHOD FOR REAL-TIME FIRMWARE CONFIGURATION AND DEBUGGING APPARATUS

(71) Applicant: REALTEK SEMICONDUCTOR CORP., Hsinchu (TW)

(72) Inventors: Yue-Feng Chen, Suzhou (CN); Dong Fang, Suzhou (CN); Guo-Dong Gao, Suzhou (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 51 days.

(21) Appl. No.: 17/378,924

(22) Filed: Jul. 19, 2021

(65) Prior Publication Data
US 2022/0334179 A1 Oct. 20, 2022

(30) Foreign Application Priority Data

Apr. 16, 2021 (CN) .......................... 202110409754.2

(51) Int. Cl.
*G01R 31/317* (2006.01)
*G01R 31/3183* (2006.01)
(Continued)

(52) U.S. Cl.
CPC . *G01R 31/31705* (2013.01); *G01R 31/31721* (2013.01); *G01R 31/318314* (2013.01);
(Continued)

(58) Field of Classification Search
CPC ........ G01R 31/31705; G01R 31/31721; G01R 31/318314; G01R 31/318516; H03K 19/17728
(Continued)

(56) References Cited

U.S. PATENT DOCUMENTS 9,203,408 B1 * 12/2015 Peng ................ H03K 19/17756
9,606,175 B2   3/2017 Trethewey et al.
(Continued)

FOREIGN PATENT DOCUMENTS

CN  105607998 A   5/2016
CN  111934931 A  11/2020
(Continued)

*Primary Examiner* — John J Tabone, Jr.
(74) *Attorney, Agent, or Firm* — Li & Cai Intellectual Property (USA) Office

(57) ABSTRACT

A method for real-time firmware configuration and a debugging apparatus are provided. When a demand for updating or debugging a target processor raises, in the method, a computer system generates a firmware debugging request that is attached with a firmware data with a specific debugging function. The computer system then loads the firmware data to a programmable logic unit of the debugging apparatus. After the real-time firmware configuration is completed, the computer system issues a debugging command to the programmable logic unit. The programmable logic unit obtains at least one debugging action after resolving the debugging command. The at least one debugging action is performed in the target processor when the target processor receives the at least one debugging action. A debugging result is returned after the at least one debugging action is completed.

20 Claims, 5 Drawing Sheets

(51) Int. Cl.
   *G01R 31/3185* (2006.01)
   *H03K 19/17728* (2020.01)
(52) U.S. Cl.
   CPC ............... *G01R 31/318516* (2013.01); *H03K 19/17728* (2013.01)
(58) Field of Classification Search
   USPC ........................................ 714/724, 725, 721
   See application file for complete search history.

(56) References Cited

U.S. PATENT DOCUMENTS

| | | | |
|---|---|---|---|
| 10,198,333 B2 | | 2/2019 | Trobough et al. |
| 10,718,812 B2 | | 7/2020 | Kuehnis et al. |
| 11,280,829 B1 | * | 3/2022 | Poolla ................ G01R 31/3177 |
| 2012/0005656 A1 | * | 1/2012 | Chuang ................ G06F 13/385 |
| | | | 717/124 |
| 2016/0274187 A1 | | 9/2016 | Menon et al. |
| 2018/0285241 A1 | | 10/2018 | Lucia et al. |
| 2019/0303268 A1 | * | 10/2019 | Ansari ................ G06F 11/3656 |
| 2020/0348360 A1 | | 11/2020 | Kuehnis et al. |
| 2021/0119632 A1 | * | 4/2021 | Zhu ................ G01R 31/318519 |
| 2021/0365591 A1 | * | 11/2021 | Desai .................... G06F 21/577 |
| 2022/0003817 A1 | * | 1/2022 | Khatri ................... G06F 21/572 |
| 2022/0334179 A1 | * | 10/2022 | Chen .............. G01R 31/318314 |

FOREIGN PATENT DOCUMENTS

| | | |
|---|---|---|
| CN | 112506727 A | 3/2021 |
| EP | 0869434 A2 | 10/1998 |

* cited by examiner

METHOD FOR REAL-TIME FIRMWARE CONFIGURATION AND DEBUGGING APPARATUS

CROSS-REFERENCE TO RELATED PATENT APPLICATION

This application claims the benefit of priority to Patent Application No. 202110409754.2, filed on Apr. 16, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure is related to a method for updating firmware, and more particularly to a method capable of loading a firmware data to a debugging apparatus for debugging firmware of a target processor in real time.

BACKGROUND OF THE DISCLOSURE

In an electronic device, when a processor therein has a need to be updated and debugged, a debugger with a specific debugging function can be used to debug the firmware of the processor. One way can be conducted by firstly having the electronic device connected to a computer device, and then having the debugger executed in the computer device perform debugging and reveal the specific position where the error codes occur, thus allowing the error codes to be corrected.

Under some circumstances, for obtaining more updated functions, firmware data of the debugger should also be upgraded according to instructions provided by the manufacturer of the device. Whether or not the firmware can be upgraded successfully is affected by many factors, such as network environment or an operator's proficiency. Functions implanted into a traditional debugging program generally remain unchanged for long periods of time since a frequency for upgrading the firmware is low. Therefore, a conventional debugging program is difficult to be applied to a new electronic device.

In view of the above-mentioned conventional technologies, debuggers with a tracing function have been developed. However, the debuggers with the tracing function may not be applicable to that many devices since the debuggers are expensive and are only applicable to certain specific processor architectures.

SUMMARY OF THE DISCLOSURE

The present disclosure aims to address inadequacies in conventional debuggers whose firmware data in a computer system are not update-friendly and are specifically used for debugging target processors of specific devices, or in more powerful debuggers that are only applicable to debugging specific processor architectures. Therefore, since a single-chip multi-core architecture has become mainstream for processors and requires a debugger with a variety of tracing functions at a lower cost, a method for real-time firmware configuration and an apparatus for debugging according to the present disclosure are provided. For satisfying various needs, a computer system that performs the method of the present disclosure is able to debug target processors by using a debugging apparatus having the latest firmware data in real time.

According to one embodiment of the present disclosure, in the method for real-time firmware configuration, a computer system generates a firmware debugging request that is attached with a firmware data specific to a debugging function. The firmware debugging request is then transmitted to a connecting interface unit of a debugging apparatus via a connection interface. Next, the connecting interface unit loads the firmware data to a programmable logic unit of the debugging apparatus. When the computer system determines that the firmware data is successfully loaded to the programmable logic unit, a debugging command is generated. The debugging command is transmitted to the programmable logic unit via the connecting interface unit. The programmable logic unit then resolves the debugging command for acquiring at least one debugging action and transmits the debugging command to a debugging interface of the target processor. The target processor performs the debugging command, i.e., the at least one debugging action. After the at least one debugging action is completed, a debugging result is returned.

Preferably, when the firmware data is successfully loaded to the programmable logic unit, the programmable logic unit returns signals to the connecting interface unit, and the connecting interface unit also returns a message of a successful firmware configuration to the computer system.

Preferably, a sampling circuit of the debugging apparatus is used to obtain voltage signals of the target processor and the voltage signals are transmitted to the computer system. The computer system uses the voltage signals to generate voltage parameters that allow a power control circuit of the debugging apparatus to match a voltage of the target processor. A debugging command is then generated.

In at least one embodiment of the present disclosure, the debugging command records actions of setting up breakpoints of the target processor, single-stepping and/or reading and writing a memory of the target processor. Further, the debugging command includes actions of free-running operation of the target processor, visiting internal and external resources of the target processor, tracing a performance of the target processor, and/or monitoring an internal status of the target processor in real time.

According to at least one embodiment of the debugging apparatus, the debugging apparatus mainly includes a connecting interface unit used to be connected to a computer system, and a programmable logic unit. The computer system transmits the firmware data to the programmable logic unit via the connecting interface unit and a peripheral circuit unit. The peripheral circuit unit includes a power control circuit, a sampling circuit and a protective driving circuit. The peripheral circuit unit is used to test external signals voltage parameters and set up a voltage and a driving force of the signals of the debugging apparatus. When a need for debugging arises, the debugging apparatus performs a method for real-time firmware configuration.

In the debugging apparatus, a debugging bus is disposed between the programmable logic unit and the peripheral circuit unit. The debugging bus is used to convert a parallel data to a data in compliance with a format of the debugging bus. The data is then transmitted to a target processor via the protective driving circuit. The debugging apparatus includes a high-performance parallel interface that is used to trace the target processor with a trace port in real time.

Further, a utilization rate of transmission bandwidth is improved by utilizing a random access memory of the debugging apparatus to be a data storage unit for buffering data.

Still further, the data transmitted from the computer system to the programmable logic unit via the connecting interface unit includes configuration data of the programmable logic unit, so that the programmable logic unit implements functions of combinational logics and sequential logics, and includes data packets allowing the target processor to perform various debugging actions.

Further, a field programmable gate array is used to implement the programmable logic unit that adopts a look-up table in a static random access memory.

These and other aspects of the present disclosure will become apparent from the following description of the embodiment taken in conjunction with the following drawings and their captions, although variations and modifications therein may be affected without departing from the spirit and scope of the novel concepts of the disclosure.

DETAILED DESCRIPTION OF THE EXEMPLARY EMBODIMENTS

Figure 1:
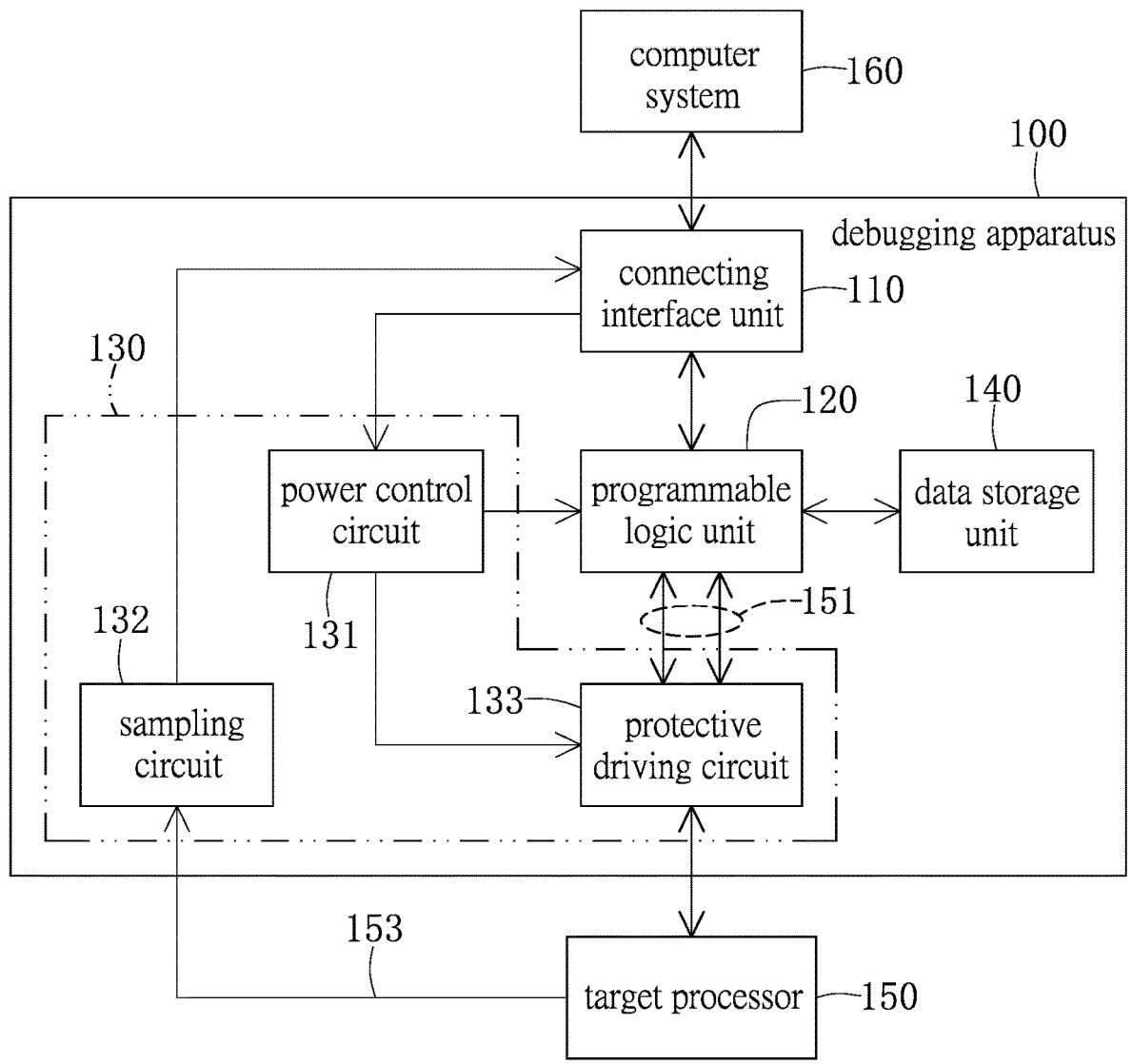
FIG. 1 is a schematic diagram depicting a debugging apparatus that performs a method for real-time firmware configuration in certain embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure is related to a debugging process performed on a computer system that operates an operating system. The debugging process is implemented by using a computer program being operated in the operating system for debugging a target processor which can be a microprocessor or a central processing unit of an electronic device. In the debugging process, the computer system is connected with a debugging apparatus via a connection interface, e.g., a universal serial bus (USB), and then loads a firmware data having a specific debugging function to the debugging apparatus. The debugging apparatus is a target to be debugged and therefore performs a debugging process to a target processor therein with the firmware data. When the debugging apparatus is connected with the computer system via the connection interface, the computer system initializes the debugging apparatus and recognizes the debugging apparatus. The computer system issues a debugging command to the debugging apparatus, and the debugging command includes tracing a status of the debugging apparatus. After initialization, the debugging process is initiated to debug or update a firmware of the target processor. It is noted that the debugging process can be implemented by using a tool program provided by a manufacturer of the target processor, and the tool program is used to find out erroneous codes by means of a single-stepping and breakpoints. The tool program may also conduct a tracing mode and other diagnosis procedure, so that the errors not only are found, the errors can also be corrected.

The present disclosure provides a method for real-time firmware configuration and a debugging apparatus. The method allows a computer system to perform configuration of a firmware data quickly and instantly. In a main aspect, when debugging a firmware of an electronic device, for example, updating a firmware of a target processor of the electronic device, a firmware data with a specific debugging function can be instantly loaded to the debugging apparatus. Generally, the firmware data with a specific updating or debugging function can be downloaded from an online server in which a web server is provided by a manufacturer. Then, the firmware data can be configured to the debugging apparatus which can initiate a firmware updating process for the target processor. After the firmware is updated, the electronic device can be shut down or rebooted. In the meantime, the firmware data in the debugging apparatus can be deleted. This debugging process may only be in milliseconds and can be adapted to various updating requirements.

FIG. 1 is a schematic diagram depicting the debugging apparatus that performs the method for real-time firmware configuration in certain embodiments of the present disclosure. In FIG. 1, a computer system 160 and a debugging apparatus 100 are shown. When any target processor 150 requires firmware updating, diagnosis or debugging, the computer system 160 can be connected with the debugging apparatus 100 via a connecting interface unit 110, such as a USB. The computer system 160 then initiates a firmware debugging process by generating a firmware debugging request. The firmware debugging request that is attached with a firmware data specific to a debugging function is transmitted to the debugging apparatus 100. After the firmware data is successfully loaded, the debugging apparatus 100 performs debugging to the target processor 150.

In certain embodiments of the present disclosure, the target processor 150 is the target to be debugged. The debugging apparatus 100 essentially includes a connecting interface unit 110, a programmable logic unit 120, a peripheral circuit unit 130 and a data storage unit 140. The connecting interface unit 110 can operate under a high-speed transmission mode such as a USB 2.0/3.0 transmission mode that can satisfy most of the requirements of the target processor 150 for debugging and updating. In addition to the conventional debugging buses such as joint test action group (JTAG) and serial wire debug (SWD) provided by the debugging apparatus 100, the debugging apparatus 100 can also provide a high-performance parallel interface such as MICTOR38 for tracing performance of the target processor 150 with a trace port in real time. Further, the debugging apparatus 100 can trace one status data in the debugging process and another status data read from the target processor 150 via the debugging bus 151 in real-time for performance analysis.

In certain embodiments of the present disclosure, the programmable logic unit 120 acquires the firmware data according to a practical need for debugging. The firmware data can be flexibly updated by linking the computer system 160 to an external server via a network connection. The data storage unit 140 is electrically connected with the programmable logic unit 120 and is one of the selectable components in the debugging apparatus 100. In general, the data storage unit 140 can be implemented by using a random access memory (RAM). The data storage unit 140 can be used for buffering data and is beneficial to increase a utilization rate of a transmission bandwidth of the connecting interface unit 110 so as to accelerate debugging. In the diagram, the peripheral circuit unit 130 includes a power control circuit 131, a sampling circuit 132 and a protective driving circuit 133. The peripheral circuit unit 130 is capable of testing external signals voltage parameters and setting up voltages and a driving force of the signals of the debugging apparatus 100.

According to certain embodiments of the debugging apparatus 100, the connecting interface unit 110 includes an interface chip (e.g., a USB chip) and a peripheral circuit. In an exemplary example, the connecting interface unit 110 can be operated under a USB 2.0 high-speed mode having an ideal speed of 480 Mbps. The connecting interface unit 110 of the debugging apparatus 100 is in charge of three tasks. A first task is a normal data transmission task in which the debugging command received from the computer system 160 is transmitted to a next level element such as the target processor 150 in parallel, and the debugging data received from the next level element such as the target processor 150 is transmitted back to the computer system 160. A second task is a firmware upgrading task that is responsible for configuring the programmable logic unit 120, and the upgraded firmware can implement specific logic functions for debugging. A third task is to monitor and read voltage parameters of the target processor 150, and monitoring data are transmitted to the computer system 160 for further processing.

According to the abovementioned embodiment of the debugging apparatus 100, the computer system 160 transmits two types of the firmware data to the programmable logic unit 120 via the connecting interface unit 110, e.g., the USB, of the debugging apparatus 100. A first type of the firmware data is a configuration data of the programmable logic unit 120 for implementing the specific combinational logics and the sequential logics. A second type of the firmware data is data packets that allow the target processor 150 to perform various debugging actions so as to form a firmware debugging request, which records, but is not limited to, setting up breakpoints of the target processor, single-stepping for the target processor, free-running the target processor, visiting internal and external resources of the target processor, and tracing performance of the target processor 150, such as monitoring internal status of the target processor. The internal status of the target processor is such as the data in a bus and some instructions such as jump.

In certain embodiments of the present disclosure, the programmable logic unit 120 can be implemented by a field programmable gate array (FPGA) and implements a look-up table (LUT) in a static random access memory (SRAM). The parallel data transmitted from the connecting interface unit 110 can be buffered in the data storage unit 140, or converted into data having a format in compliance with a specific bus such as the debugging bus 151. The data is then transmitted to the target processor 150 by the protective driving circuit 133. A reverse data flow can be deduced by analogy based on the above steps.

In certain embodiments of the present disclosure, the peripheral circuit unit 130 essentially includes the power control circuit 131, the sampling circuit 132 and the protective driving circuit 133. At least three functions are provided by the peripheral circuit unit 130. A first function of the peripheral circuit unit 130 is to test a voltage of an external debugging interface by the sampling circuit 132 and test result is sent back to the computer system 160 via the connecting interface unit 110. A second function of the peripheral circuit unit 130 is to improve the ability of driving signals and provide an overcurrent protection for circuit components in the debugging apparatus 100. A third function of the peripheral circuit unit 130 is to transmit the voltage parameters received from the computer system 160 via the connecting interface unit 110 to the power control circuit 131 that allows the power control circuit 131 to output an accurate voltage to the programmable logic unit 120 and the protective driving circuit 133 so as to achieve the purpose of matching a voltage of the target processor 150.

Figure 2:
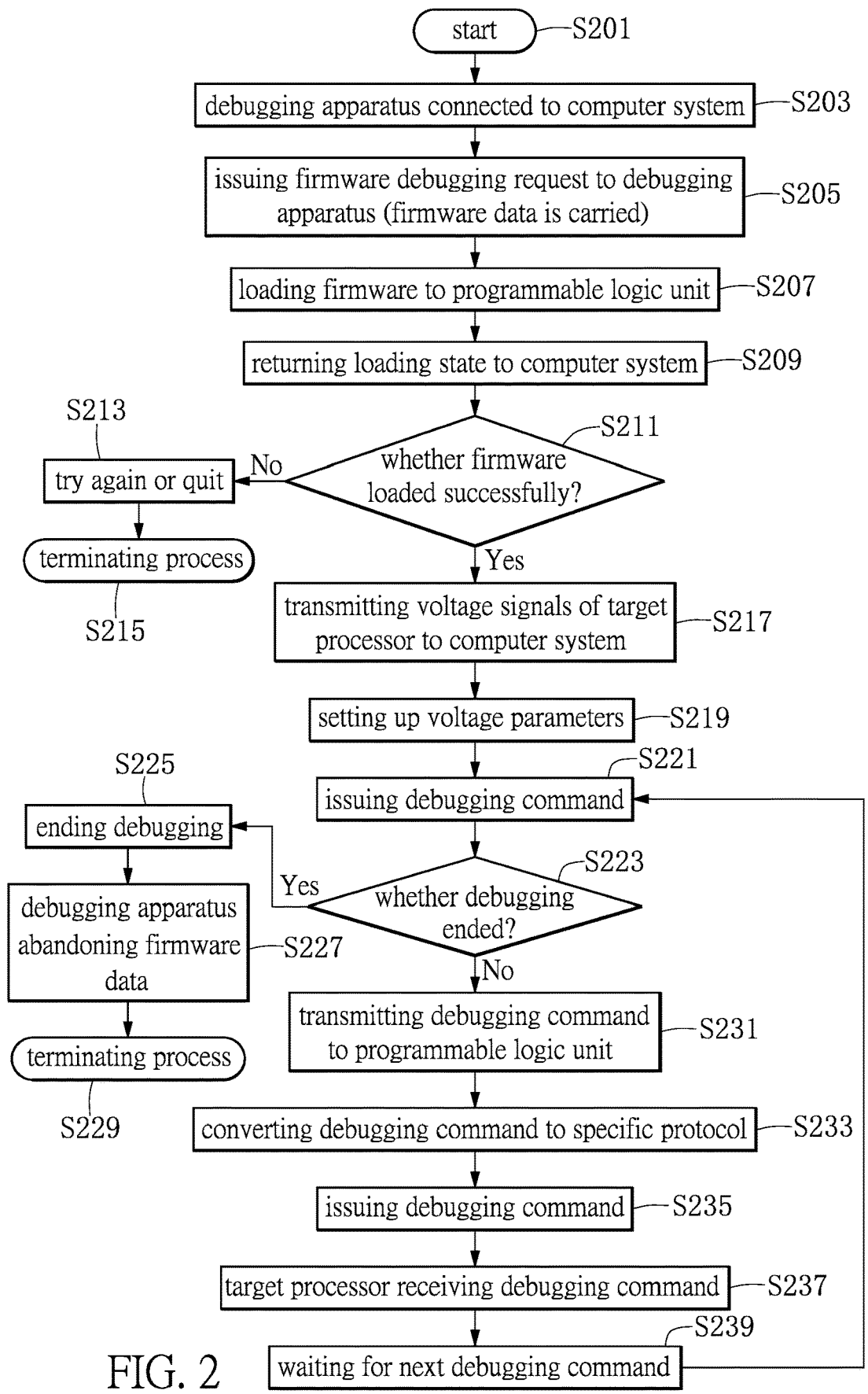
FIG. 2 is a flow chart describing the method for real-time firmware configuration in certain embodiments of the present disclosure.
Figure 3:
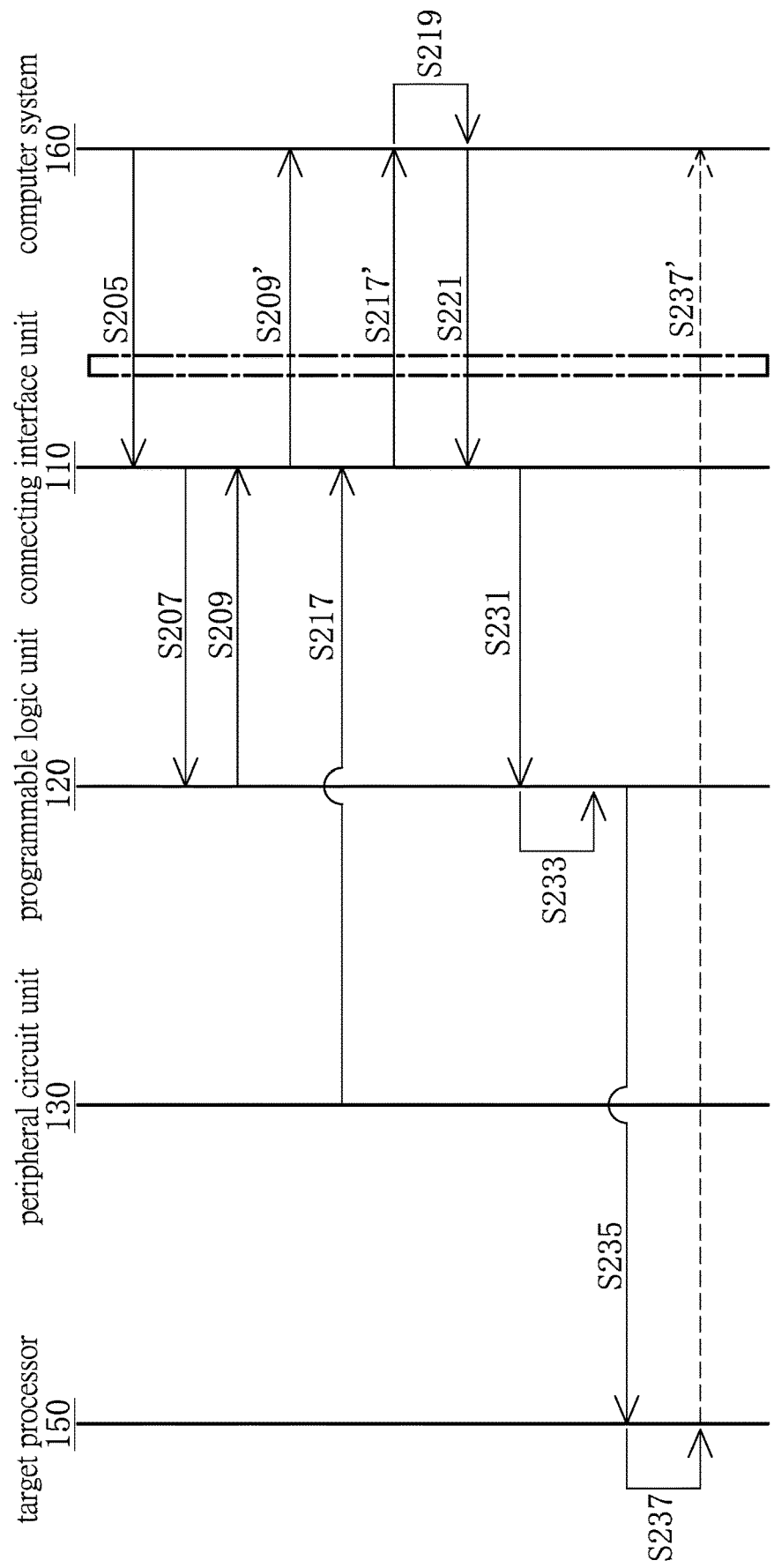
FIG. 3 is a flow chart describing the method for real-time firmware configuration performed in the debugging apparatus in certain embodiments of the present disclosure.

FIG. 2 is a flow chart describing a method for real-time firmware configuration in certain embodiments of the present disclosure, and can be viewed in conjunction with the embodiments as shown in FIG. 3, which is a flow chart describing the method performed in the debugging apparatus in certain embodiments of the present disclosure. The method particularly relates to a collaborative process among the connecting interface unit 110, the programmable logic unit 120, the data storage unit 140 and the peripheral circuit unit 130 of the debugging apparatus 100, and an operating process for debugging the target processor 150 in real-time.

In the beginning of the method, one or more firmware data ready for debugging the target processor 150 are prepared in the computer system 160. The one or more firmware data can be verified in advance or is confirmed to be obtained from a verified source. The one or more firmware data can be stored in a storage device of the computer system 160. A software process operated in the computer system 160 is such as a process operated by a driver for driving the debugging apparatus 100, and used to perform a firmware debugging process at any time according to a demand. When any target processor 150 needs to be debugged, the firmware debugging process is performed as described in the embodiment as follows.

In the flow chart shown in FIG. 2, the process begins when the target processor 150 requests a need for firmware update (step S201). The debugging apparatus 100 is connected to the computer system 160 via a specific interface such as a USB. Via the USB, the computer system 160 can supply power to the debugging apparatus 100 for data transmission (step S203). Next, the software process operated in the computer system 160 generates a firmware debugging request that can be a request for upgrading firmware and attached with a requisite firmware data for debugging. The firmware debugging request is then transmitted to the connecting interface unit 110 (step S205). The connecting interface unit 110 loads the firmware debugging request and the firmware data to the programmable logic unit 120 when acknowledging a new debugging demand (step S207). After the firmware debugging request and the firmware data are loaded to the programmable logic unit 120, the programmable logic unit 120 returns a signal to the connecting interface unit 110 (step S209). Further, the programmable logic unit 120 also returns a message indicative of a successful firmware configuration to the computer system 160 through the connecting interface unit 110 (step S209'). On the contrary, if the firmware debugging request and the firmware data fail to be loaded to the programmable logic unit 120, a failure message is returned to the computer system 160 and further adjustment may be made to the method for firmware configuration in real time.

At this time, the software process operated in the computer system 160 can determine whether or not the firmware data is successfully loaded to the programmable logic unit 120 (step S211). If the firmware data is not successfully loaded to the programmable logic unit 120, the software process continues to check if there is a need or related data for performing firmware debugging, or decides to quit this process (step S213). Then the procedure is ended if the software process decides to quit the process (step S215). On the contrary, if the firmware data is loaded to the programmable logic unit 120 successfully, the process goes on as the debugging apparatus 100 enters a debugging mode.

Next, the debugging apparatus 100 acquires voltage signals of the target processor 150 by a sampling circuit (i.e., the sampling circuit 132 of FIG. 1), and transmits the voltage signals to the computer system 160 (i.e., step S217 of FIG. 2 and step S217' of FIG. 3). The computer system 160 relies on the voltage signals to set up the voltage parameters (step S219) which are configured to be provided to a power control circuit (i.e., the power control circuit 131 of FIG. 1). The power control circuit of the debugging apparatus 100 relies on the voltage parameters to match the voltage of the target processor 150. The debugging process is performed since the debugging apparatus 100 has matched the voltage of the target processor 150.

After the above initialization process, the computer system 160 issues a debugging command recording actions of setting up breakpoints, single-stepping or reading and writing a memory of the target processor 150 (step S221). The follow up steps S231-S239 are then processed. Since the debugging process is to perform at least one debugging action with respect to various items, the debugging process can be repeated until the debugging is completed. In step 223, the software process executed in the computer system 160 can determine if the debugging process ends. The debugging process ends if the debugging is completed (step S225). At the same time, the debugging apparatus 100 abandons the firmware data used for the current debugging process (step S227). After the debugging process is ended, the debugging apparatus 100 disconnects the computer system 160 (step S229).

During the debugging process, when the connecting interface unit 110 of the debugging apparatus 100 receives the debugging command, the debugging command is converted into a parallel data and the parallel data is transmitted to the programmable logic unit 120 (step S231). The programmable logic unit 120 resolves the parallel data so as to acquire at least one debugging action. Afterwards, the debugging command is converted for debugging the hardware, or converted into a specific protocol in compliance with a debugging bus (e.g., the debugging bus 151 of FIG. 1) (step S233). The debugging command is then transmitted to the peripheral circuit unit 130 in the format of the debugging bus. The peripheral circuit unit 130 adjusts and transmits the debugging command to a debugging interface of the target processor 150 (step S235). The target processor 150 receives the debugging command and accordingly performs a debugging process. In the debugging process, the at least one debugging action is obtained by resolving the debugging command (step S237). A debugging result is returned to the computer system 160 after the debugging process is completed (step S237'). The debugging apparatus 100 can wait for a next request for firmware updating (step S239) and returns to step S221.

Figure 4:
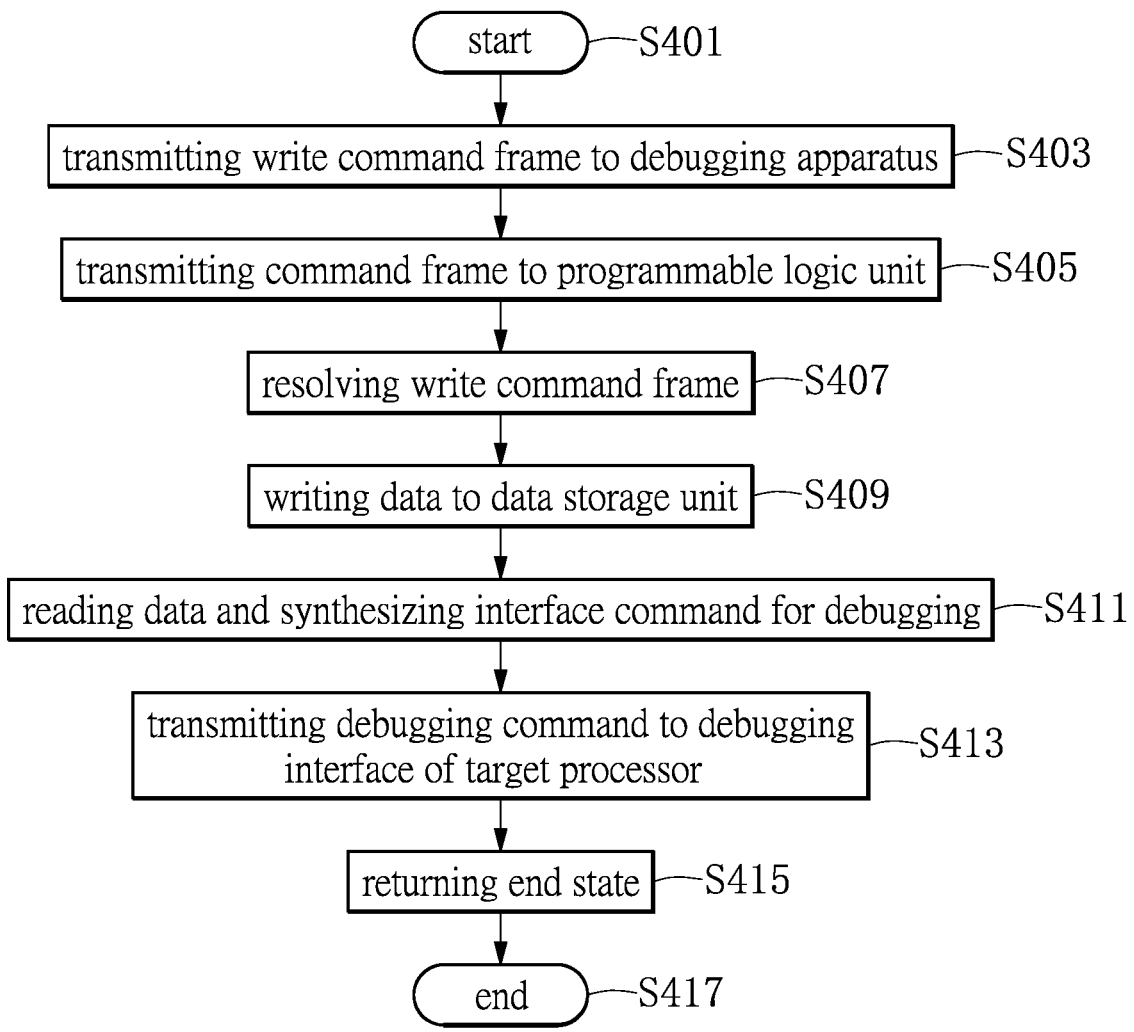
FIG. 4 is a flow chart describing a process of a write command in the method for real-time firmware configuration in certain embodiments of the present disclosure.

An exemplary process of a write command in the debugging process can be referred to FIG. 4, which is a flow chart of a write command in the method for real-time firmware configuration in certain embodiments of the present disclosure.

Figure 5:
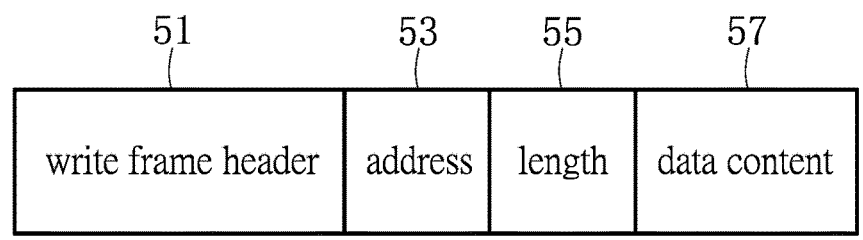
FIG. 5 is a schematic diagram depicting a format of a debugging command frame to be transmitted in certain embodiments of the present disclosure.

A firmware debugging process is initiated (step S401) for transmitting a write command to a target processor (e.g., the target processor 150 of FIG. 1). A computer system (e.g., the computer system 160 of FIG. 1) composes a write command frame. Reference is made to FIG. 5, which is a schematic diagram depicting a format of a debugging command in certain embodiments of the present disclosure. The write command frame records a write frame header 51, an address 53, a length 55 and data content 57. The write command frame is transmitted via the connecting interface unit 110 to the debugging apparatus 100 connected with the computer system 160 (step S403). In the debugging apparatus 100, the write command frame is transmitted to the programmable logic unit 120 (step S405). The programmable logic unit 120 resolves the write command frame (step S407) so as to acquire a write command and the data content 57. The related data is buffered to the data storage unit 140 (step S409).

After that, the programmable logic unit 120 continues to read the data content 57 of the write command frame from the data storage unit 140. The programmable logic unit 120 composes an interface command for debugging, i.e., composes the interface command having a format in compliance with a series of protocols of the debugging bus 151 of the debugging apparatus 100. For example, the aforementioned format meets a variety scans of instruction register (IR) and data register (DR) (step S411). Next, the debugging command, i.e., the write command, is transmitted to the target processor 150 via the debugging interface (step S413) and the target processor 150 performs firmware debugging according to the command.

After the debugging command is completed, the programmable logic unit 120 returns a debugging result to the computer system 160 via the connecting interface unit 110 (step S415), and the process of the write command is ended (step S417). The computer system 160 can then issue new commands.

Figure 6:
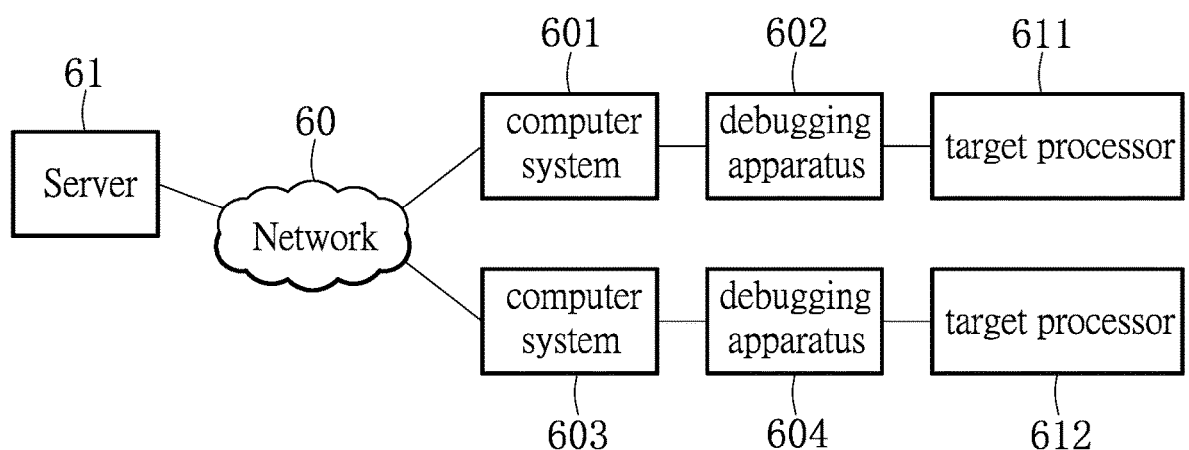
FIG. 6 is a schematic diagram depicting a system that performs the method for real-time firmware configuration in certain embodiments of the present disclosure.

The computer system 160 is able to store the firmware data with various debugging functions for supporting various needs of debugging to various target devices. The method can obtain authorized firmware data from an external system. FIG. 6 is a schematic diagram depicting a system for real-time firmware configuration in certain embodiments of the present disclosure.

In FIG. 6, a server 61 stores various firmware data with various debugging functions provided by manufacturers of various target devices, referring to the target processor 150 of FIG. 1. The server 61 can support various needs of debugging at different sites via a network 60. The computer systems 601 and 603 can use the debugging apparatuses 602 and 604 to debug the target processors 611 and 612 respectively at any time, and can confirm whether or not firmware data requiring debugging are present in the computer systems 601 and 603. The computer systems 601 and 603 can download required firmware data from the server 61 if there is any need for debugging.

In conclusion, according to the aforementioned embodiments of the method for real-time firmware configuration and the debugging apparatus, the debugging apparatus is used to be connected to a computer system that allows a user to operate a debugging process. The debugging apparatus is provided to debug a target processor, and the computer system can load the firmware data with a specific debugging function to the debugging apparatus in real time. Afterwards, the debugging apparatus performs debugging to the target processor, such that the method meets various needs of debugging.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for real-time firmware configuration, comprising:
generating a firmware debugging request by a computer system, and transmitting the firmware debugging request to a connecting interface unit of a debugging apparatus via a connection interface, wherein a firmware data specific to a debugging function is attached to the firmware debugging request;
loading the firmware data to a programmable logic unit of the debugging apparatus from the connecting interface unit;
generating a debugging command, by the computer system, if the firmware data is successfully loaded to the programmable logic unit;
issuing the debugging command to the programmable logic unit from the connecting interface unit;
resolving the debugging command, by the programmable logic unit, for acquiring at least one debugging action; and
transmitting the debugging command to a debugging interface of a target processor, performing, by the target processor, the at least one debugging action, and returning a debugging result after the at least one debugging action is completed.

2. The method according to claim 1, wherein the debugging apparatus is connected with the computer system via a universal serial bus and the computer system supplies power to the debugging apparatus for data transmission.

3. The method according to claim 1, wherein, after confirming that the firmware data is successfully loaded to the programmable logic unit, the programmable logic unit returns a signal to the connecting interface unit and returns a message indicating a successful firmware configuration to the computer system via the connecting interface unit.

4. The method according to claim 1, wherein the debugging apparatus acquires voltage signals of the target processor by a sampling circuit, and the voltage signals are transmitted to the computer system.

5. The method according to claim 4, wherein the computer system sets up voltage parameters according to the voltage signals of the target processor, and a power control circuit of the debugging apparatus matches a voltage of the target processor according to the voltage parameters, so as to generate the debugging command.

6. The method according to claim 5, wherein the debugging command records actions of setting up breakpoints of the target processor, single-stepping, and/or reading and writing a memory of the target processor.

7. The method according to claim 6, wherein the debugging command further includes free-running operation of the target processor, visiting internal and external resources of the target processor, tracing a performance of the target processor, and/or monitoring an internal status of the target processor in real time.

8. The method according to claim 1, wherein, after completing that at least one debugging action, the programmable logic unit discards the firmware data of the current debugging action.

9. A debugging apparatus, comprising:
a connecting interface unit, by which the debugging apparatus is connected to a computer system;
a programmable logic unit, wherein the computer system transmits a firmware data to the programmable logic unit via the connecting interface unit; and
a peripheral circuit unit including a power control circuit, a sampling circuit and a protective driving circuit, and being used to test external signals voltage parameters and set up a voltage and a driving force for the debugging apparatus;
wherein the debugging apparatus performs a method for real-time firmware configuration, comprising:
generating a firmware debugging request by the computer system, and transmitting the firmware debugging request to the connecting interface unit via a connection interface, wherein the firmware data is attached to the firmware debugging request;
loading the firmware data to the programmable logic unit of the debugging apparatus from the connecting interface unit;
setting up voltage parameters according to voltage signals of a target processor if the computer system determines that the firmware data is successfully loaded to the programmable logic unit, and enabling the power control circuit to match a voltage of the target processor so as to generate a debugging command;

issuing the debugging command to the programmable logic unit from the connecting interface unit;

resolving the debugging command, by the programmable logic unit, for acquiring at least one debugging action; and transmitting the debugging command to a debugging interface of the target processor, performing, by the target processor, the at least one debugging action, and returning a debugging result after the at least one debugging action is completed.

10. The debugging apparatus according to claim 9, wherein a debugging bus is disposed between the programmable logic unit and the peripheral circuit unit, parallel data transmitted from the connecting interface unit is converted to have a format in compliance with the debugging bus, and the parallel data is then transmitted to the target processor by the protective driving circuit.

11. The debugging apparatus according to claim 10, further comprising a high-performance parallel interface used to perform real time tracing on the target processor that has a trace port.

12. The debugging apparatus according to claim 9, further comprising a data storage unit implemented by a random access memory, the data storage unit is electrically connected with the programmable logic unit for buffering data, and allows for an increase to a utilization rate of a transmission bandwidth of the connecting interface unit.

13. The debugging apparatus according to claim 9, wherein the data transmitted from the computer system to the programmable logic unit via the connecting interface unit includes configuration data of the programmable logic unit, so that the programmable logic unit implements functions of combinational logics and sequential logics, and includes data packets allowing the target processor to perform various debugging actions.

14. The debugging apparatus according to claim 9, wherein the debugging apparatus is connected with the computer system via a universal serial bus and the computer system supplies power to the debugging apparatus for data transmission.

15. The debugging apparatus according to claim 9, wherein, after confirming that the firmware data is successfully loaded to the programmable logic unit, the programmable logic unit returns a signal to the connecting interface unit and returns a message indicating a successful firmware configuration to the computer system via the connecting interface unit.

16. The debugging apparatus according to claim 15, wherein the programmable logic unit is implemented by a field programmable gate array and the programmable logic unit adopts a look-up table in a static random access memory.

17. The debugging apparatus according to claim 9, wherein the debugging apparatus acquires the voltage signals of the target processor by a sampling circuit, and the voltage signals are transmitted to the computer system.

18. The debugging apparatus according to claim 9, wherein the debugging command records actions of setting up breakpoints of the target processor, single-stepping, and/or reading and writing a memory of the target processor.

19. The debugging apparatus according to claim 18, wherein the debugging command further includes actions of free-running operation of the target processor, visiting internal and external resources of the target processor, tracing a performance of the target processor, and/or monitoring an internal status of the target processor in real time.

20. The debugging apparatus according to claim 9, wherein, after completing the at least one debugging action, the programmable logic unit discards the firmware data of the current debugging action.

* * * * *